United States Patent [19]

Hartman et al.

[11] Patent Number: 4,669,084

[45] Date of Patent: May 26, 1987

[54] ERROR CORRECTION PROCESSING SCHEME FOR SEQUENTIAL CODEC

[75] Inventors: William F. Hartman, Palm Bay; Robert W. Boyd, Melbourne, both of Fla.

[73] Assignee: Harris Corporation, Melbourne, Fla.

[21] Appl. No.: 737,040

[22] Filed: May 23, 1985

[51] Int. Cl.⁴ .............................................. G06F 11/10
[52] U.S. Cl. ..................................................... 371/43
[58] Field of Search ............................. 371/43, 44, 45

[56] References Cited

U.S. PATENT DOCUMENTS

| | | | |
|---|---|---|---|
| 3,699,516 | 10/1972 | Mecklenburg | 371/43 |
| 4,015,238 | 3/1977 | Davis | 371/43 |
| 4,240,156 | 12/1980 | Doland | 371/43 |
| 4,291,406 | 9/1981 | Bahl et al. | 371/44 |
| 4,295,218 | 10/1981 | Tanner | 371/45 X |
| 4,354,269 | 10/1982 | Vries et al. | 371/43 |
| 4,500,994 | 2/1985 | McCallister et al. | 371/43 |
| 4,536,878 | 8/1985 | Rattlingourd et al. | 371/43 |

OTHER PUBLICATIONS

Lin et al., Error Control Coding-Fundamentals and Applications, Prentice-Hall, Inc., 1983, pp. 360-364.
Clark, Jr. et al., Error-Correction Coding for Digital Communications, Plenum Press, New York, 1981, pp. 297-330.

Primary Examiner—Charles E. Atkinson
Attorney, Agent, or Firm—Antonelli, Terry & Wands

[57] ABSTRACT

A modified Fano signal processing scheme for a sequential codec defers a portion of path metric processing operations to a subsequent processing cycle by parallel branch metric processing. Rather than calculate and execute the effective path metric threshold changes in the same processing cycle, any threshold change that should result from the present processing cycle is fed forward to the branch metric calculation circuit so as to be readily available for use in the next processing cycle without having to be stored and subsequentially processed during the same processing cycle. The error correction/data recovery processor preferably employs a syndrome generator configured of a programmable read only memory which receives the bit stream to be processed and supplies impulse response bits to respective stages of a bidirectional shift register/exclusive-OR circuit. Also, the error correction processor is configured to accommodate multiple code rates through a common hardware arrangement which is implemented on the basis of a rate ¾ code that makes it readily adaptable to both rate ½ and ⅞ codes.

23 Claims, 6 Drawing Figures

ERROR CORRECTION PROCESSING SCHEME FOR SEQUENTIAL CODEC

FIELD OF THE INVENTION

The present invention relates in general to digital data communication systems and is particularly directed to an improved error correction processing scheme employed in a sequential encoder/decoder (codec).

BACKGROUND OF THE INVENTION

Sequential codecs are commonly used in digital data communication systems that employ systematic convolutional codes to permit correction of errors that occur in the course of a transmission. For this purpose, at the transmit end of the link the encoding portion of the codec periodically inserts error correction (parity) bits into a stream of data bits to be transmitted based upon some prescribed encoding algorithm (and code rate). Typical convolutional code rates are $\frac{1}{2}$ (1 parity bit inserted for each data bit), $\frac{3}{4}$ (1 parity bit inserted for every three data bits) and $\frac{7}{8}$ (1 parity bit inserted for every seven data bits. At the receive end of the link, the decoding portion of the codec attempts to reconstruct the original data stream using the additional information provided by the parity bits to correct for errors in the received data.

The algorithm that is used to generate the parity bits (encode) typically involves a scheme that is mathematically equivalent to convolution of the data sequence with a set of code generator polynomials, wherein selected ones of a sequence of bits are combined in accordance with a prescribed generator polynomial using an exclusive-OR logic circuit In the course of correcting for errors and recovering the data at the receive end of the link, polynomial convolution is used in a syndrome generator wherein received parity bits are combined with a locally generated parity bit sequence to control the (branch selection) operation of the error correction processor. Because the error correction scheme typically employs a trial and error (Fano) processing algorithm whose next action depends on the result of the previous trial, conventional sequential codec error correction processing schemes typically execute all branch metric processing in serial fashion within a single decoder cycle, so that the error recovery processing speed is directly impacted by the data rate.

SUMMARY OF THE INVENTION

In accordance with the invention there is provided an improved encoding and error correction scheme for a sequential codec that offers both an increase in signal processing speed and what is considered to be a more efficient hardware configuration for realizing the encoding/decoding polynomial convolution function. For increasing signal processing speed, the present invention employs a modified Fano signal processing algorithm that permits a portion of processing operations to be deferred to a subsequent processing cycle by a parallel processing scheme, thereby enabling the use of a higher speed processing clock. Rather than calculate and execute the effective path metric threshold changes in the same processing cycle, as it carried out in conventional Fano processing schemes, the present invention defers effecting path metric threshold changes until the next processing cycle. The effect of any threshold change that would normally be executed during the present processing cycle is fed forward to the branch metric calculation circuit so as to be readily available for use in the next processing cycle without having to wait for the threshold change to be processed during the present processing cycle.

As an additional feature of the present invention, the polynomial convolver (which may be employed for both parity and syndrome generation) employs a highly efficient hardware configuration incorporating a programmable read only memory which receives the data stream to be processed and supplies output bits to respective stages of a bidirectional shift register/exclusive-OR circuit. Through a set of exclusive-OR circuits which are selectively multiplexed (e.g. under control of the Fano processor) to a storage element (flip-flop), the polynomial convolution function can be rapidly sequenced in either direction along the data sequence. Moreover, the simplicity of each stage permits the hardware to be configured from programmable array logic, thereby enhancing the microminiaturization of the processor and providing an increase in flexibility and cost savings.

As a further feature of the present invention, the error correction processor is configured to readily accommodate multiple coding rates through a common hardware arrangement. The decoder processes four (serial) channel bits during each cycle of operation supporting normal Fano algorithm decoding of a rate $\frac{3}{4}$ code (which has 4 bits per code branch). Incorporating appropriate modifications into the polynomial convolution function and Fano algorithm allows the same (4 bit) processor to support other code rates such as rate $\frac{1}{2}$ (2 bits per code branch) and rate $\frac{7}{8}$ (8 bits per code branch).

DETAILED DESCRIPTION

Before describing, in detail, the particular improved sequential codec architecture in accordance the present invention, it should be observed that the present invention resides primarily in a novel structural combination of conventional signal processing circuits and not in the particular detailed configurations thereof. Accordingly, the structure, control and arrangement of these conventional signal processing circuits have been illustrated in the Drawings by readily understandable block representations and schematic/logic diagrams, which show only those specific details that are pertinent to the present invention, so as not to obscure the disclosure with structural details which will be readily apparent to those skilled in the art having the benefit of the description herein. In addition, various portions of the data/signal processing system have been appropriately consolidated and simplified in order to emphasize those portions that are most pertinent to the present invention. Thus, the block illustrations of the Figures do not necessarily represent the mechanical structural arrangement of the exemplary system, but are primarily intended to illustrate the major structural components of the system in a convenient functional grouping whereby the present invention may be readily understood.

As pointed out briefly above, the present invention is directed to several new and improved aspects of a sequential codec, including an improved hardware configuration for the encoder/syndrome generator polynomial convolution, a rate 2/4 processing scheme, and an improved processing arrangement for increasing the speed of the Fano algorithm.

POLYNOMIAL CONVOLUTION GENERATOR

Figure 1:
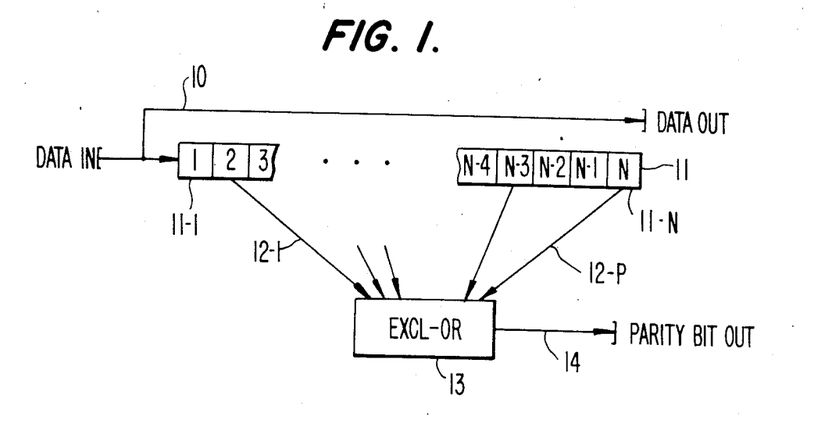
FIG. 1 is a functional logic diagram of a generalized polynomial convolution generator.

Referring to FIG. 1, there is shown a functional logic diagram of a generalized polynomial convolution function generator which, as described briefly above, may be considered to convolve a code generator polynomial with the data sequence (necessary for data encoding and decoding). Encoding is achieved by coupling a digital data stream supplied over a data link 10 to the first stage 11-1 of a plurality of sequential stages (1 ... N) of a serial shift register 11. Each stage of the shift register 11, for a single bit data stream, may comprise an individual flip-flop. The outputs of the shift register are selectively coupled (in accordance with the code generator polynomial) over links 12-1 ... 12P to an exclusive-OR function circuit 13, the output 14 of which represents one term of the convolution. In a sequential codec, the convolution bit usually corresponds to a parity bit that is to be interleaved (according to the code rate) with the data stream over link 10. The polynomial convolver shown in FIG. 1 is used both at the transmit end of the system and at the receive end of the link. Namely, the codec employs an encoder portion and a decoder portion, for generating the parity bits (encoding) and for reevaluating the parity bits relative to the received data stream (syndrome forming), respectively.

Figure 2:
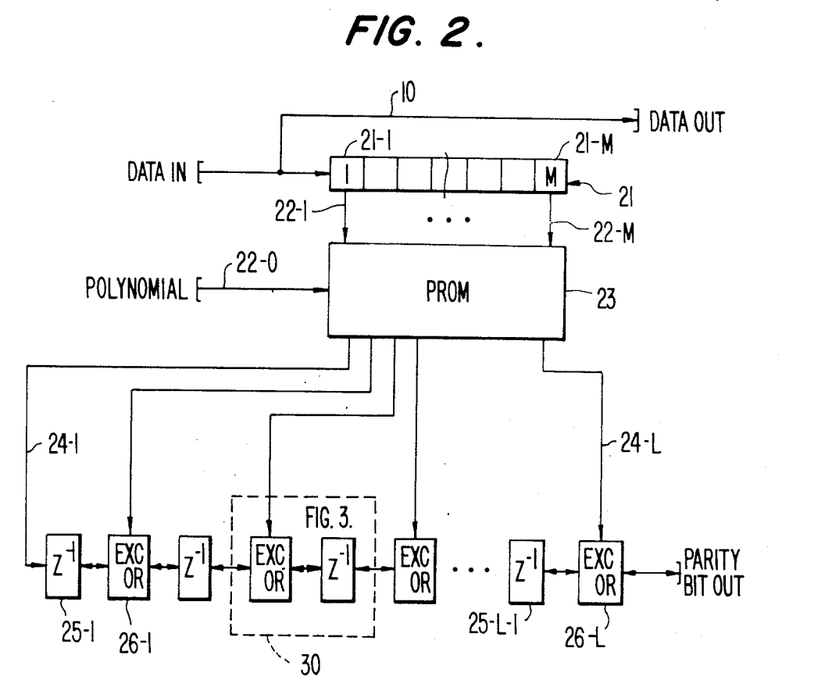
FIG. 2 is a schematic block diagram of a polynomial convolution generator employing a programmable read only memory-controlled bidirectional shift register, exclusive-OR circuit.

For implementing the polynomial convolution represented by FIG. 1, the present invention employs a multistage shift register which is used to address a lookup table stored in a programmable read only memory (PROM), the output bits of which are supplied to a bidirectional shift register/exclusive-OR circuit from the last stage of which the derived convolution bit is produced. This configuration is shown in FIG. 2, wherein input data link 10 is coupled to the first stage 21-1 of a multi-stage (1—M) shift register 21. Since a rate k/n code requires a k-bit register, the length of shift register 21 is sufficient to accommodate the maximum value of k employed.

For the illustrative coding rates referenced previously (namely ½, ¾, ⅞) shift register 21 may comprise a seven stage shift register sufficient to accommodate up to seven sequential data bits (for rate ⅞) from which a parity bit is to be derived. (For lower values of k e.g. rates ½, ¾, the number of stages to be used may be reduced accordingly). The respective outputs 22-1 ... 22-M of the stages 21-1 ... 21-M of shift register 21 are coupled as address inputs to an impulse response PROM 23 in which the impulse response of register 11 (FIG. 1) is stored as a lookup table. Since the PROM can store impulse responses associated with a multiplicity of generator polynomials, address lines 22-0 are used to indicate which polynomial should be used. Depending upon the multi-bit code represented by the data bits in the shift register 21, PROM 23 will supply corresponding impulse response bits over links 24-1 ... 24-L to respective stages of a multi-bit shift register/exclusive-OR circuit. This circuit is comprised of a plurality of storage stages 25-1 ... 25-L—1 and associated exclusive-OR circuits 26-1 ... 26-L coupled between each successive storage stage of the shift register. The first output bit 24-1 of PROM 23 is coupled to the first stage 25-1 of the shift register. The remaining outputs 24-2 ... 24-L of PROM 23 are coupled to the exclusive-OR circuits 26-1 ... 26-L to be logically combined (exclusive-ORed) with the contents of previous or upstream stages 25-1 ... 25-L—1, respectively, of the shift register to produce a parity bit on output link 14.

In the logic diagram of FIG. 2, the signal coupling lines between exclusive-OR circuits 26-1 ... 26-L and memory elements 25-1 ... 25-L—1 are shown as being bidirectional, to illustrate the capability of the hardware configuration of FIG. 2 to operate in both forward and reverse directions (for both generating the parity bits at the transmit end of the link and for evaluating the syndrome at the receive end of the link). At the transmit end of the link, the parity bit generation scheme of FIG. 2 operates in the forward direction only, as it sequentially produces parity bits to be inserted or interleaved with the data bits in accordance with the code rate. At the receive end of the link, however, within the syndrome generators employed by the error correction processor, the polynomial convolver must have the capability of moving either forward or backward, to accommodate the trial and error signal processing of the Fano algorithm. To provide for this dual capability, each stage of the polynomial function generator shown logically and functionally in FIG. 2 preferably comprises the hardware configuration shown in FIG. 3.

Figure 3:
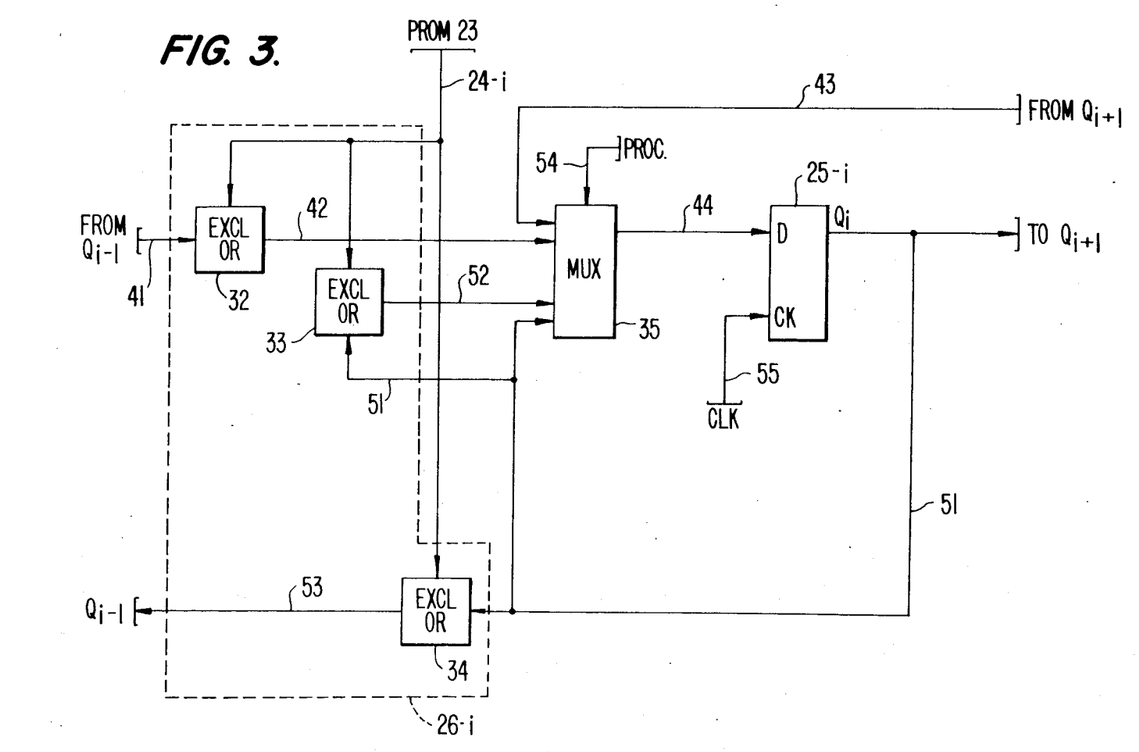
FIG. 3 is a schematic logic diagram of a respective stage of the bidirectional shift register, exclusive-OR circuit.

More particularly, FIG. 3 illustrates the actual circuit configuration of an individual stage 30 containing a respective storage element 25-i and an exclusive-OR function element 26-i shown in FIG. 2, described above. As shown in FIG. 3, an individual storage element is comprised of a flip-flop 25-i coupled to the output 44 of a multiplexer 35. Multiplexer 35 has a set of four inputs, a first 42 of which is coupled to the output of an exclusive-OR circuit 32. Exclusive-OR circuit 32 is coupled over link 41 to the Q output of flip-flop 25-i—1 of the previous stage i—1 and to a respective output 24-i from PROM 23. Link 24-i is also coupled as an input to additional exclusive-OR circuits 33 and 34. Exclusive-OR circuit 33 is further coupled over link 51 to the Qi output of flip-flop 25-i. The output of exclusive-OR circuit 33 is coupled over link 52 as one of the inputs to multiplexer 35. The second input of exclusive-OR circuit 34 is coupled to link 51, while its output is coupled over link 53 as one input to the multiplexer of the previous stage of I-i. Link 51 supplies a third input to multiplexer 35, while a fourth input thereof is coupled over link 43 to the Q output of flip-flop 25-i+1 of stage i+1. Multiplexer 35 is controlled by link 54 to selectively couple one of the inputs 42, 53, 51, 52 output link 44 to the D input of flip-flop 25-i. The state of link 44 is clocked into flip-flop 25-i by a (Fano) processor clock signal on link 55.

OPERATION

The bidirectional shift register/exclusive-OR circuit of FIG. 3 has four modes of operation. In the normal encoding mode, wherein partial convolution bits are clocked forward (in time) or in the shift-right direction through the shift register, multiplexer 35 couples link 42 at the output of exclusive-OR circuit 32 to output link 44. Thus, the partial convolution bit from a previous stage $i-1$ is exclusive-ORed with the impulse response bit on link 24-i from PROM 23 and loaded into flip-flop 25-i by clock signal 55. Output 51 of flip-flop 25-i is coupled to the next successive stage $i+1$, so that the partial convolution bits for each stage are sequentially clocked in the forward direction through the shift register.

For backing up or effectively reversing the above operation, so as to remove the effect of (previously input) code branches (as may be necessary in the processing of the Fano processor) multiplexer 35 is controlled to couple input link 43 from the next successive stage $i+1$ to link 44 of stage i. When the output of the next successive stage $i+1$ is loaded into flip-flop 25-i, the state of link 51 is then exclusive-ORed with the bit on line 24-i from PROM 23 and coupled over link 53 to the immediately proceeding stage i-1. (This state is used in a backup mode of the syndrome processing operation in accordance with the Fano algorithm, as noted above).

Where it is desired to simply maintain a state of the shift register, the output of flip-flop 25-i is looped back into its input via link 51 through multiplexer 35 and output link 44.

It is also possible to feed back the contents of a respective stage to itself through the use of an exclusive-OR circuit 33, which exclusive-ORs the state of link 51 (the output of flip-flop 25-i) and impulse response line 24-i from PROM 23 and couples the result over link 52 to multiplexer 35. Exclusive-OR circuit 33 is used in this mode for rate ⅞ coding, since, as noted previously, the processor operates on sequential four bit sequences.

Because of the simplicity of a respective stage of the bidirectional shift register/exclusive-OR configuration shown in FIG. 3, it is readily adaptable to programmable array logic, thereby providing a very efficient implementation using present day integrated circuit building block technology.

RATE 2/4 ERROR CORRECTION PROCESSING SCHEME

Figure 4:
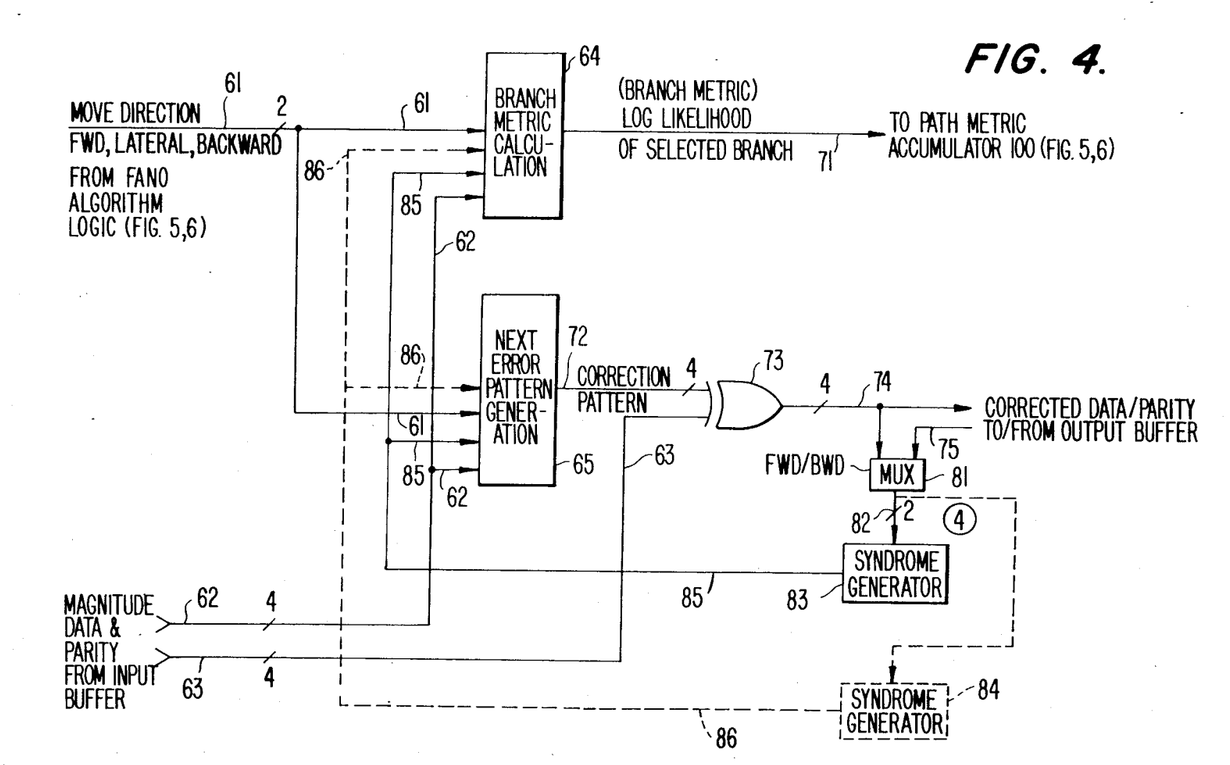
FIG. 4 is a schematic block diagram of a rate $\frac{3}{4}$ signal processor for data recovery with modifications to effect rate $\frac{1}{2}$ processing.

As noted previously, a further aspect of the present invention is a modification of conventional 4-bit processing hardware to enable rate ½ decoding, (by considering code branches to be 4 bits long; two data bits plus two parity bits) and thereby effectively accomplish both rate ½ and rate ¾ decoding by the same signal processing architecture. FIG. 4 shows a block diagram of a portion of a rate ¾ decoder (and modifications required for rate 2/4 decoding), which receives incoming data and vector steering information (from the Fano algorithm logic) and provides an output to the path metric accumulator (within the Fano processor) representative of the correlation of the received sequence to the code branch selected by the Fano algorithm.

More specifically, from the Fano processing logic contained within the error correction signal processing circuitry to be described below with reference to FIGS. 5 and 6 a vectoring control signal (code) directing the operation of the branch metric calculation circuitry 64 is supplied. A code on link 61 is employed by branch metric calculation circuitry 64 in the selection of the code path to be followed. Branch metric calculation circuit 64 and an associated next error pattern generation circuit 65 are typically comprised of combinational logic, or implemented in programmable read only memories as lookup tables, as part of the error correction circuitry. As the details of these components are conventional and not necessary for an understanding of the present invention, they will not be described here. Instead, as pointed out previously, the modification of the rate ¾ processor configuration which enables the signal processing components to effectively implement rate 2/4 (rate ½ equivalent) processing will be described in detail.

The output of the branch calculation circuit 64 is coupled over link 71 to the path metric accumulator (FIGS. 5 and 6) in which a correlation of the selected code path is maintained. The phrase "branch metric" is used in its normal sense to correspond to the logarithm of the likelihood of the branch along which the branch metric calculations are trying to move (given the data that was received). The data itself is coupled over links 62 and 63 to each of branch calculation circuit 64 and error pattern generator 65. A code representative of the reliability of the data is coupled over link 62 while the data itself (including the inserted parity bits as received by the codec) are coupled over link 63. Link 62 couples the reliability data (and parity) to both metric calculation circuit 64 and error pattern generator 65. Link 63 couples the data and parity bits stream to an exclusive-OR circuit 73.

As pointed out previously, as part of the signal processing circuitry, a syndrome generator (which preferably employs a hardware configuration of the polynomial generator shown in FIGS. 2 and 3) processes the incoming data stream (data plus parity) and forms a syndrome that is indicative of the errors in the received data. For rate ¾ processing, this is typically accomplished by a single syndrome generator 83 which is coupled over link 74 to the output of exclusive-OR circuit 73 via multiplexer 81 and supplies and output over link 85 to each of branch metric calculation circuit 64 and error generation circuit 65. Syndrome generator 83 operates to effectively carry out an exclusive-OR operation on the received parity bit stream and the locally generated parity bit stream to provide a series of syndrome bits to which the error pattern generator 65 and the branch metric calculation circuit 64 respond in selecting the most likely branch among the possible code branches and its metric, respectively. Because the processing circuitry may move along the code path in both a forward and backward direction, it is sometimes necessary to unload from the output buffer (not shown) a code branch that has been previously selected but has been found to be unsuitable for extending the code path. Thus, syndrome generator 83 is coupled via multiplexer 81 to the output buffer via link 75. Depending upon whether the decoder is proceeding in a forward or backward direction, multiplexer 81 will be controlled by the Fano algorithm processing logic (FIGS. 5 and 6) to select one of links 74 and 75.

In accordance with the present invention rate 2/4 is accomplished by modifying the rate ¾ architecture of FIG. 4 to include a parallel syndrome generator 84 which operates in association with syndrome generator 83 to generate respective pairs of syndrome bits. Like syndrome generator 83, syndrome generator 84 is coupled to the output of multiplexer 81 and supplies its syndrome bit stream over link 86 to each of branch metric calculation circuit 64 and error pattern generator 65. In the processor shown in FIG. 4, syndrome generator 83 is employed for or assigned to the even parity bits, whereas syndrome generator 84 is associated with the odd parity bits to provide for the full four bit capacity Thus, through the addition of the additional syndrome generator 84 rate 2/4 processing (and thereby effectively rate 1/2 processing) is carried out using the same circuitry that was used for rate 3/4 processing.

LOOK AHEAD FANO PROCESSING LOGIC

During decoding, the Fano algorithm decides whether to extend the current code path or back up and try a different path by comparing the (accumulated) path metric to a threshold. This threshold must be tightened (raised) or loosened (lowered) whenever certain sets of conditions are detected. (In practice, to avoid numerical problems, the threshold is held constant and the appropriate change is made to the path metric.) In accordance with conventional Fano algorithmic processing, a threshold change is carried out during each processing cycle as determined (in part) by the value of the path metric accumulator within that processing cycle. Because all operations within a processing cycle are conducted sequentially, substantial hardware for that purpose and, consequently, substantial processing time are required. Of necessity, since the rate at which the data can be processed is governed by the clock speed of the processor, the substantial accumulation, storage and changing of the path metric total necessarily impacts the signal processing speed.

Figure 5:
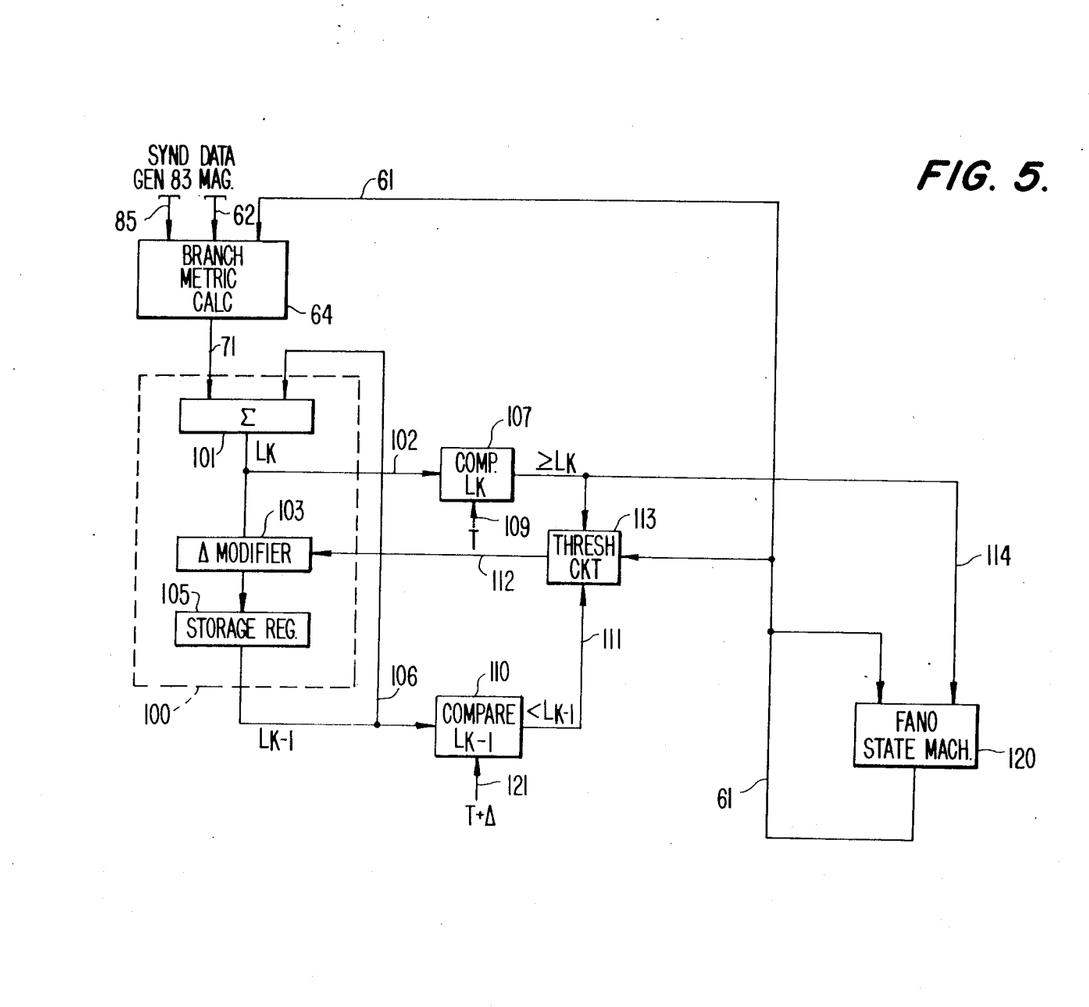
FIG. 5 is a functional block diagram of a conventional Fano algorithm processor that may be employed for controlling the operation of the error correction/data recovery architecture of FIG. 4.

FIG. 5, shows in block diagram form, the general configuration of a conventional Fano algorithm processor which responds to the selected branch metric value produced by the branch metric calculation circuit (for example, circuit 64 shown in FIG. 4) and supplies the branch metric vector controls signals on link 61 to the branch metric calculation circuit 64 and error pattern generator 65. Branch metric calculation circuit 64 itself is also shown in FIG. 5 as being coupled to links 61, 62 and 85 (as shown in FIG. 4, described above). The output of the branch calculation circuit 64 is coupled over link 71 to a path metric accumulator 100 comprised of adder 101, path metric modifier circuit 103 and storage register 105. Path metric accumulator 100 maintains a running total of the branch metric values supplied over link 71 for each successive processing cycle. For this purpose the output of adder 101 (the sum of the previous path metric derived from storage circuit 105 coupled over link 106 and the current branch metric value supplied over link 71) is coupled over link 102 to path metric modifier circuit 103 which adds or subtracts a prescribed value $\Delta$ to the output of adder 101 and couples the result over link 104 to storage register 105. The output on link 102 is also supplied to a comparison circuit 107 wherein the summation value is composed with a threshold code (T) coupled over link 109. Comparator 107 supplies an output over link 114 indicating whether or not the threshold T is greater than or equal to the accumulation value from path metric accumulator 101. Link 114 is coupled to a threshold logic circuit 113 and to a Fano state machine 120. The output of storage register 105 is also coupled to a second comparison circuit 110 which compares the previous cycle's accumulation total (as stored in register 105) and the threshold T plus some threshold change $\Delta$ supplied over link 121. Comparator 110 supplies an output over link 111 indicating whether or not the threshold plus the change (i.e. $T+\Delta$) is less than the previously stored accumulation value in storage register 105. These two values (T and $T+\Delta$) on links 114 and 111 are supplied to threshold logic circuit 113 which supplies an output over link 112 to path metric modifier circuit 103 to control whether or not the contents of path metric accumulator 100 will be modified (namely whether the threshold change value $\Delta$ will be added to or subtracted from the contents of accumulator 101). The resulting value is coupled over link 104 stored in storage register 105.

Operation of the circuitry shown in FIG. 5 is controlled by the Fano state machine 120 which is comprised of combinational logic and, together with threshold logic circuit 113, controls the decision process (vectoring operation control) of branch metric calculation lookup table 64 and path metric modifier circuit 103. The rules for the operation of the Fano algorithm logic circuit shown in FIG. 5 are listed below in Table 1.

TABLE 1

| Rule | Previous (K-1) Move | THRESHOLD COMPARISONS Comparator 110 | Comparator 107 | Next (K) Move 61 | Final Threshold T 113 |
|---|---|---|---|---|---|
| 1 | FORWARD (FWD) or LATERAL (LAT) | $L_{K-1} < T + \Delta$ | $L_K \geq T$ | FWD | $T = T + \Delta$ IF $L_k \geq T + \Delta$ |
| 2 | FWD or (LAT) | $L_{K-1} \geq T + \Delta$ | $L_K \geq T$ | FWD | NO CHANGE |
| 3 | FWD or (LAT) | Any $L_{K-1}$ | $L_K < T$ | BACKWARD (BCK) | NO CHANGE |
| 4 | BCK | $L_{K-1} < T$ | | FWD | $T = T - \Delta$ |
| 5 | BCK | $L_{K-1} \geq T$ | | BCK IF NO NEXT LIKELY PATH AVAILABLE LAT ON NEXT MOST LIKELY PATH | NO CHANGE |

Table 1 corresponds to conventional Fano decoding rules as described in a text on the subject entitled "Error-Correction Code for Digital Communications" by Clark and Cain, published by Plenum Press (1981).

In accordance with the operation of the Fano algorithm circuit of FIG. 5, the contents of the path metric accumulator 100 may be incremented (decremented) on every processing cycle by the threshold logic circuit 113 and path metric modifier circuit 103. This necessarily means that signal processing speed, which depends upon the sequential processing configuration of the Fano algorithm circuit, is limited.

In accordance with the present invention, rather than employ a dedicated modifier circuit 103 to increment or decrement the branch metric total within the same processing cycle, the Fano algorithm processor is configured to defer scaling of the contents of the path metric accumulator to a subsequent processing cycle, by incorporating the modification operation itself into the branch metric calculation lookup table 64. As a result, although there is achieved the desired modification of the contents of the path metric accumulator 100, it is achieved by controlling the input to the path metric accumulator 100 or, in effect, prescaling its contents. Moreover, this is carried out upstream of the path metric accumulator during the next succeeding processing cycle so that the speed of operation of the Fano algorithm logic can be increased.

Figure 6:
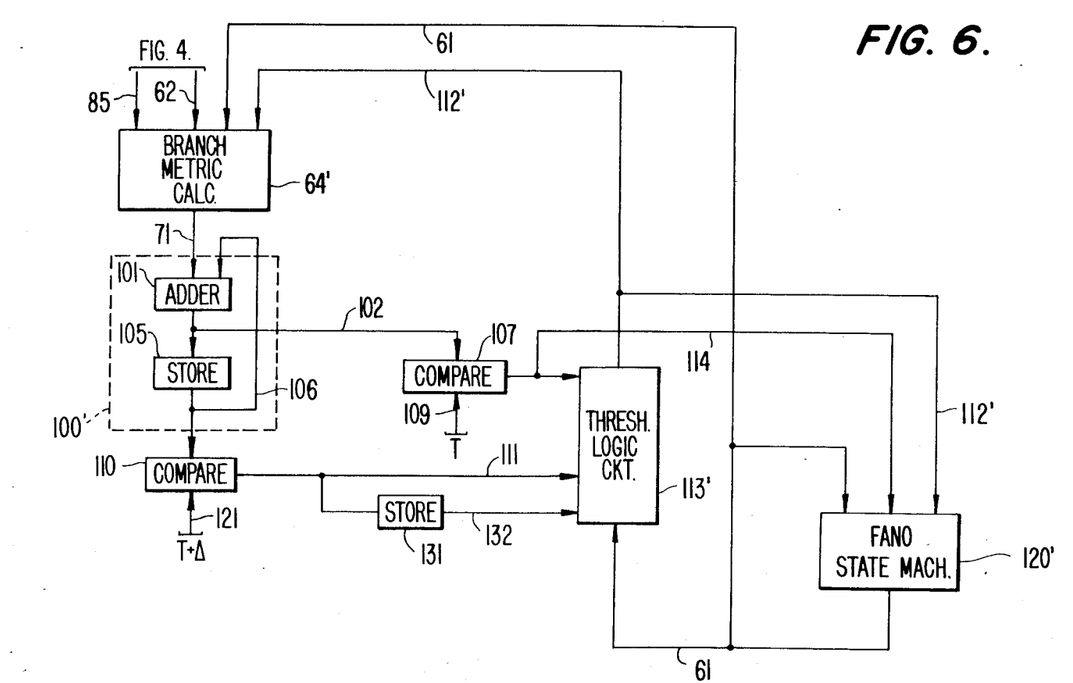
FIG. 6 is a functional block diagram of a modification of the Fano algorithm processor of FIG. 5 for deferring path metric threshold changes until the next processing cycle.

More particularly, with reference to FIG. 6, there is shown a modified Fano algorithm processor in accordance with the present invention wherein the detection of the need for and actual the scaling operation is deferred until the next processor cycle. Like the Fano processor of FIG. 5, the modified Fano processor of the present invention employs a branch metric calculation circuit 64' to which the syndrome generator output supplied over link 85 and the data magnitude values supplied over link 62 are coupled. Vector control signals from a Fano state machine 120' are supplied over link 61'. In addition, a threshold logic control signal supplied over link 112' is coupled to the branch metric calculation circuit 64'. The output of branch metric calculation circuit 64' is coupled over link 71 to adder 101 of to path metric accumulator 100'. The output of adder 101 is coupled over link 102 to path metric storage register 105. It is also coupled over link 102 to comparator 107, which compares the output of adder 101 with a path metric threshold T supplied over link 109 and supplies an output signal over link 114 to Fano state machine 120'. The output of storage register 105 is coupled over link 106 to comparator 110 wherein the previous cycle path metric accumulation value is compared with the threshold T plus the threshold change $\Delta$ supplied over link 121. Like the Fano processor shown in FIG. 5, the output of comparison circuit 110 is applied to threshold logic circuit 113'. In addition, it is temporarily stored for use by threshold logic circuit 113' in the next processing cycle in storage circuit 131, the output of which is coupled over link 132 to threshold logic circuit 113'.

Unlike the processing configuration of FIG. 5, wherein a path metric modifier circuit 103 is included within the path metric accumulator to modify the output of adder 101 in response to the threshold change (scaling) decision produced by threshold logic circuit 113, the processing scheme of FIG. 6 defers the detection of the need for and effect of any threshold change decision produced by threshold logic circuit 113 by removing modifier 103 and employing, instead, a modified lookup table effected by branch metric calculation circuit 64' thus allowing the detection and implementation of the actual change to occur in parallel with other processing operation. For this purpose the output of threshold logic circuit 113' is coupled over link 112' to branch metric calculation circuit 64' and to state machine 120'. In the course of calculating a respective branch metric for a given cycle, branch metric calculation circuit employs the threshold change decision of the previous cycle as produced by threshold logic circuit 113'. The operation of the modified Fano processor of FIG. 6 is best understood by reference to Tables 2 and 3 below which list the rules for the overall Fano processor and those governing the threshold changes as determined by threshold logic circuit 113', respectively.

TABLE 2

| RULE | PREVIOUS (K-1) MOVE | THRESHOLD COMPARISONS | NEXT MOVE |
|---|---|---|---|
| 1 | FWD or LAT | $L_K + TC \geq T$ | FWD |
| 1A | FWD | $\overline{TH+}$ | FWD |
| 2 | | (SEE TABLE 3) | |
| 3 | FWD or LAT | $L_K + TC < T$ | BCK |
| 4 | BCK | $L_{K-1} + TC < T$ | FWD |
| 5 | BCK | $L_{K-1} + TC \geq T$ | BCK IF NO NEXT LIKELY PATH AVAILABLE LAT ON NEXT MOST LIKELY PATH AVAILABLE |
| TC | $= -\Delta$ FOR TH+ | | SEE TABLE 3 |
| | $= +\Delta$ FOR TH- | | |
| | $= 0$ OTHERWISE | | |

TABLE 3

| RULE 2 THRESHOLD EQUATIONS | |
|---|---|
| TH+ = | $FWD_{K-1}$ AND $\overline{TH-}$ AND $PM_{K-1} \geq \Delta$ AND $PM_{K-2} < \Delta$ where $PM = L_K + TC$ |
| TH- = | $BCK_{K-2}$ AND $L_{K-1} < 0$ |

As particularly delineated in Table 3, which lists the threshold equations for Rule 2, threshold changes for a respective processing cycle are incorporated into the path metric calculation effected by branch metric calculation circuit 64' based upon the threshold change decision of the previous cycle. As a result, current cycle threshold change and storage (as is carried out by modifier circuit 10 and storage circuit 105 of FIG. 5) is avoided. As pointed out above, in order to provide for the use of the result of the comparison output of comparator 110 for the immediately previous cycle (i.e. cycle K-2), as set forth in Table 3, storage register 131 is coupled between comparator 110 and threshold logic circuit 113'.

Advantageously, with the modified processor of FIG. 6 which effectively defers the effect of a threshold change to the next processing cycle, the number of sequential processing steps that are normally carried out by the Fano processor in the same processing cycle can be reduced. As a result a higher frequency processing clock can be utilized, thereby enhancing the efficiency and throughput of the codec.

While we have shown and described an embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed:

1. A signal processing circuit for generating an output signal based upon the contents of an input signal sequence comprising:

an input link over which said input signal sequence is coupled:

first means, coupled to said input link, for storing a plurality of prescribed codes which are accessible by the contents of an input signal sequence coupled over said input link;

a storage register having a plurality of stages, a prescribed one of which stages is coupled to receive a portion of a code stored by said first means;

a plurality of logic circuits respectively intercoupled between the successive stage of said storage register so as to form an intercoupling path therewith and being adapted to logically combine signals representative of respective portions of a code accessed from said first means with the contants of respective ones of the stages of said storage register and to controllably intercouple results of the logically combined signals and respective contents to respective stages of said storage register; and second means, coupled to the intercoupling path through said storage register and said logic circuits, for generating said output signal.

2. A signal processing circuit according to claim 1, wherein said input link includes a shift register coupled to receive said input signal sequence, the respective stage of said shift register defining the contents of the input signal sequence in accordance with which said prescribed codes are accessed.

3. A signal processing circuit according to claim 2, wherein said first means comprises a programmable read only memory from respective memory locations in which said prescribed codes are accessed by the contents of the respective stages of said shift register so as to be coupled to respective ones of said plurality of logic circuits.

4. A signal processing circuit according to claim 3, wherein said memory has a plurality of output lines over which signals representative of the respective contents of codes accessed from said memory are coupled to respective ones of said logic circuits.

5. A signal processing circuit according to claim 4, wherein one of said output lines is coupled to one of the stages of said storage register.

6. A signal processing circuit according to claim 1, wherein said storage register comprises a bidirectional shift register the respective stages of which are coupled to effectively shift the contents thereof to immediately preceding and immediately subsequent ones of said logic circuits coupled between the successive stages thereof.

7. A signal processing circuit according to claim 6, wherein said logic circuits comprise exclusive-OR logic circuits through which signals representative of respective portions of an accessed code and the contents of the stages of said bidirectional shift register are combined.

8. A circuit arrangement for logically combining a plurality of signals coupled over respective ones of a plurality of input lines to derive an output signal comprising a controllable storage register having a multiplicity of stages each $i^{th}$ stage having a signal storage portion and a logical combining portion selectively coupled with said signal storage portion, one of said plurality of input lines being coupled to the signal storage portion of the $m^{th}$ stage of said controllable storage register, said logical combining portion being coupled to a respective input line among said plurality of input lines, and means for selectively coupling said logical combining portion to receive the contents of the signal storage portions of the $(i-j)^{th}$, $i^{th}$ and $(i+k)^{th}$ stages, whereby a signal received over the input line that is coupled to the logical combining portion of the $i^{th}$ stage may be logically combined with the contents of the signal storage portion of a selected one of the $(i-j)^{th}$, $i^{th}$ and $(i+k)^{th}$ stages and the resultant signal stored in the signal stage portion of said $i^{th}$ stage.

9. A circuit arrangement according to claim 8, wherein said selectively coupling means includes means for coupling the output of said signal storage portion to the input thereof.

10. A circuit arrangement according to claim 8, wherein said logical combining portion is configured to execute an exclusive-OR function between a signal received over said input line and the contents of a signal storage portion of the selected one of said $(i-j)^{th}$, $i^{th}$, and $(i+k)^{th}$ stages.

11. A circuit arrangement according to claim 10, wherein each of j and k is equal to one.

12. A circuit arrangement according to claim 8, wherein one of said plurality of input lines is coupled to the signal storage portion of the first stage of said controllable storage register.

13. A signal processing circuit for generating an output signal based upon an input signal sequence applied thereto comprising:

first means for storing a plurality of prescribed codes signals representative of the contents of which are provided over respective ones of a plurality of lines in accordance with the contents of said input signal sequence; and a controllable storage register having a multiplicity of stages each $i^{th}$ stage having a signal storage portion and a logical combining portion selectively coupled with said signal storage portion, one of said plurality of input lines being coupled to the signal storage portion of the $m^{th}$ stage of said controllable storage register, said logical combining portion being coupled to a respecitve line among said plurality of lines, and means for selectively coupling said logical combining portion to receive the contents of the signal storage portions of the $(i-j)^{th}$, $i^{th}$ and $(i+k)^{th}$ stages, whereby a signal received over the input line that is coupled to the logical combining portion of the $i^{th}$ stage may be logically combined with the contents of the signal storage portion of a selected one of the $(i-j)^{th}$, $i^{th}$ and $(i+k^{th})$ stages and the resultant signal stored in the signal stage portion of said $i^{th}$ stage.

14. A signal processing circuit according to claim 13, wherein said first means comprises a programmable read only memory from respective memory locations in which said prescribed codes are accessed in accordance with the contents of said input signal sequence.

15. A signal processing circuit according to claim 14, further including a shift register coupled to receive said input signal sequence, the respective stages of said shift register defining the contents of the input signal sequence in accordance with which said prescribed codes are accessed.

16. A signal processing circuit according to claim 13, wherein said logical combining portion is configured to execute an exclusive-OR function between a signal received over said input line and the contents of a signal storage portion of the selected one of said $(i-j)^{th}$, $i^{th}$, and $(i+k)^{th}$ stages.

17. For use in an error correction decoder having respective odd and even parity bit lines wherein a received data/parity signal sequence is subjected to an error correction/data recovery process by logically combining received parity signals with a locally generated replica of a parity signal sequence to produce a syndrome, in response to which an error correction processor corrects for errors in received data signals having a prescribed code rate, an arrangement for enabling said decoder to process received signals having a code rate other than said prescribed code rate comprising a plurality of syndrome generators coupled between respective odd and even parity bit lines of the corrected data/parity signal sequence output line of the decoder and inputs to which the error correction processor responds for correcting for errors in the received data signals.

18. An arrangement according to claim 17, wherein said prescribed code rate is rate ¾ and the signal coupling links for received data/parity signals provide a signal code rate 2/4.

19. An arrangement according to claim 18, wherein said error correction processor employs a path metric processor.

20. For use in an error correction decoder wherein a received data/parity signal sequence is subjected to error correction/data recovery employing a branch metric calculation processor, wherein threshold modifications for successive branch metric comparisons are determined for each processing cycle, an arrangement for modifying path metric codes, employed by said metric calculation processor, in accordance with changing thresholds comprising:

first means for generating a threshold modification control signal in accordance with prescribed relationships between a branch metric value for the current processing cycle and the accumulated branch metric value for previous cycles; and second means, coupled to said first means and to said branch metric calculation processor, for causing said branch metric calculation processor to effectively alter the calculation branch metric value for the next processing cycle based upon the threshold control signal generated by said first means for the current processing cycle.

21. An arrangement according to claim 20, wherein said first means includes means for deferring the generation of said threshold modification control signal until the next processing cycle.

22. For use in an error correction decoder wherein a received data/parity signal sequence is subjected to error correction/data recovery employing a branch metric calculation processor wherein changes to thresholds for successive path metric signal processing sequences are determined for each processing cycle, a method for controlling the operation of said branch metric calculation processor comprising the steps of:

(a) generating a threshold control signal in accordance with prescribed relationships between the accumulated branch metric value calculated for the current processing cycle and the accumulated branch metric value for previous cycles; and (b) causing said branch metric calculation processor to effectively increment or decrement the calculated branch metric value for the next processing cycle in accordance with the threshold control signal generated in step (a) for the current processing cycle.

23. A method according to claim 22, wherein step (a) is carried out during said next processing cycle.

* * * * *